US012812812B2

(12) United States Patent
Keeler

(10) Patent No.: US 12,812,812 B2
(45) Date of Patent: Nov. 24, 2026

(54) INTERCONNECTABLE MICRO DATA CENTER MODULE

(71) Applicant: ZELLABOX PTY LTD, Osborne Park (AU)

(72) Inventor: Clinton Sevier Keeler, Wembley Downs (AU)

(73) Assignee: ZELLABOX PTY LTD., Osborne Park (AU)

( * ) Notice: Subject to any disclaimer, the term of this patent is extended or adjusted under 35 U.S.C. 154(b) by 702 days.

(21) Appl. No.: 18/023,051

(22) PCT Filed: Aug. 23, 2021

(86) PCT No.: PCT/AU2021/050938
§ 371 (c)(1),
(2) Date: Feb. 24, 2023

(87) PCT Pub. No.: WO2022/040730
PCT Pub. Date: Mar. 3, 2022

(65) Prior Publication Data

US 2023/0320022 A1 Oct. 5, 2023

(30) Foreign Application Priority Data

Aug. 24, 2020 (AU) ................................ 2020903021

(51) Int. Cl.
*H05K 7/14* (2006.01)
*H05K 7/20* (2006.01)

(52) U.S. Cl.
CPC ....... *H05K 7/1497* (2013.01); *H05K 7/20709* (2013.01)

(58) Field of Classification Search
CPC .... H05K 7/1497; H05K 7/20709; H05K 5/30; H05K 7/1488; H05K 7/1435; H05K 7/20754; H05K 7/20836; G06F 1/20
See application file for complete search history.

(56) References Cited

U.S. PATENT DOCUMENTS

| | | | |
|---|---|---|---|
| 8,917,513 B1 | 12/2014 | Hazzard | |
| 9,886,316 B2 | 2/2018 | Belady et al. | |
| 2009/0229194 A1 | 9/2009 | Armillas | |
| 2012/0147552 A1* | 6/2012 | Driggers | G05F 1/66 361/679.53 |
| 2012/0302150 A1 | 11/2012 | Schmitt | |
| 2014/0059945 A1 | 3/2014 | Gardner | |
| 2014/0199934 A1 | 7/2014 | Lin | |

(Continued)

OTHER PUBLICATIONS

International Search Report and Written Opinion issued in PCT/AU2021/050938, mailed Oct. 25, 2021.

*Primary Examiner* — Jacob R Crum
(74) *Attorney, Agent, or Firm* — Kilpatrick Townsend & Stockton LLP

(57) ABSTRACT

Exemplary embodiments provide an interconnectable micro data center module comprising walls that define an internal area adapted to receive server hardware apparatus, a first surface adapted for interconnection with a first module, interconnectable transmission means to facilitate power and data flow between the micro data center module and the first module, and a sensor device capable of determining when the micro data center module is interconnected with the first module.

21 Claims, 7 Drawing Sheets

(56) References Cited

U.S. PATENT DOCUMENTS

| | | | | |
|---|---|---|---|---|
| 2015/0028617 | A1* | 1/2015 | Slessman | F28F 9/0265 296/24.3 |
| 2015/0189787 | A1 | 7/2015 | Bailey et al. | |
| 2017/0359922 | A1* | 12/2017 | Bailey | H05K 7/20136 |
| 2019/0174651 | A1* | 6/2019 | Crawford | H05K 7/1497 |
| 2021/0251101 | A1* | 8/2021 | Sheehan | G06F 1/30 |

* cited by examiner

INTERCONNECTABLE MICRO DATA CENTER MODULE

CROSS REFERENCE TO RELATED APPLICATION

This application is a U.S. national phase of International Patent Application No. PCT/AU2021/050938 filed on Aug. 23, 2021, which claims priority to Australian Patent Application No. 2020903021 filed on Aug. 24, 2020. The entire contents of both such applications are hereby incorporated herein by this reference.

TECHNICAL FIELD

The disclosure relates, generally, to micro data centers and, more particularly, to an interconnectable and modular micro data center module. The disclosure has particular, but not necessarily exclusive, application to interconnectable micro data center modules for use and application in edge computing deployments and/or distributed computing environments.

BACKGROUND

Many large data center installations require the design, fit out and maintenance of a dedicated server room that houses server racks and miscellaneous IT infrastructure needed for an organisation's data storage and processing requirements. These 'server rooms' are not just typical rooms within a building, as they require careful planning and a range of additional environmental, power, and security controls systems to ensure that the organisation's data is not lost or compromised as a result of accidental or malicious activities.

Typically considerations when designing a server room include the size of the room and whether it is sufficiently large to enable future expansion and, more importantly, adequately sized to ensure that the environmental control systems operate effectively. In relation to these environmental controls, a server room will typically require a dedicated air conditioning system for temperature, ventilation and/or humidity control which, if not carefully monitored, can damage or destroy the servers. Many air conditioning systems also require the entire server room to be built on an elevated floor structure that enables better circulation of cool air to the servers. Additionally, these environmental controls will often include a dedicated fire suppression system adapted to detect and extinguish fire hazards/threats that arise within the server room. A dedicated power supply system (including an uninterruptable power supply (UPS) for redundancy) is typically also required to provide stable power to the server equipment and to prevent data loss in the event of power outages. Since water has the potential to cause significant damage to electronic server equipment, the server room must also be protected or isolated from potential water leaks as a result of existing plumbing within the building. Finally, the threat of potential malicious activities requires that most server rooms have independent secure access controls that range from simple electronic locks and security card access, through to biometric access controls and dedicated closed-circuit television (CCTV) monitoring systems.

As a result of the above requirements, the costs associated with designing, fitting out and maintaining a server room within a building can be significant. As an alternative to organisations operating their own server rooms (within their own premises), many companies invest in server rack space within colocation centers. These colocation centers are typically large data centers that are built and operated by third parties that 'rent' rack space to organisations for their servers and other network equipment. While these colocation centers enable organisations to minimise infrastructure costs associated with building and maintaining their own server rooms, there are bandwidth and physical access considerations that need to be considered. For example, if physical access to the server equipment is required by IT staff, this means travelling to the colocation center (which may, or may not, be situated nearby the organisation).

One issue common to both traditional server rooms and colocation centers is that they are highly centralised, meaning that data gathered at a wide range of locations must be transmitted back to the centralised servers for processing. The latency associated with the transfer of data to and from these server rooms and colocation centers, depending on where they are physically located relative to the data origination locations, means that centralised processing is no longer a viable option. This is particular true of certain Internet of Things (IoT) applications and/or financial sector applications that require real-time or as close to real-time processing as possible. As a result, many organisations are investing heavily in 'edge' computing capabilities to replace or augment their existing centralised (i.e. cloud) processing capability.

While it is desirable in many applications to use an edge computing capability, alone or in combination with cloud processing, there are still significant drawbacks associated with the use of edge computing devices. These include limitations around ensuring the physical security of the device, ensuring the underlying security of the data stored and processed by the edge computing device, controlling environmental conditions suitable for efficient/safe operation, and providing operational (e.g. cooling and/or power) redundancies to mitigate data loss. These are limitations typically addressed by conventional server rooms or colocation centers by carefully controlling the operational environment (i.e. a secure and purpose built room), something which is obviously more difficult to achieve in an edge computing scenario.

In view of the above mentioned problems, there is a need for a modular micro data center adapted for use in edge computing applications and expandable to address growing requirements for data storage and processing. There is also a need for a modular micro data center adapted for use in edge computing applications that can provide the environmental, operational, and physical controls of a conventional server room or colocation center.

In this specification where a document, act or item of knowledge is referred to or discussed, this reference or discussion is not an admission that the document, act or item of knowledge or any combination thereof was at the priority date, publicly available, known to the public, part of the common general knowledge; or known to be relevant to an attempt to solve any problem with which this specification is concerned.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY

The present disclosure relates to an interconnectable micro data center module comprising:

walls that define an internal area adapted to receive server hardware apparatus;

a first surface adapted for interconnection with a first module;

interconnectable transmission means to facilitate power and data flow between the micro data center module and the first module; and a sensor device capable of determining when the micro data center module is interconnected with the first module.

The interconnectable micro data center module may further comprise a first opening to enable air flow from a cooling system to circulate through the internal area of the micro data center module. The first opening may be located on the first surface of the micro data center module.

The first module may be a base module containing: (a) a power supply configured to supply power to the micro data center module via the interconnectable transmission means; and (b) the cooling system configured to cool the internal area of the micro data center module.

The interconnectable micro data center module may further comprise a second surface adapted for interconnection with a second module. The second module may be an expansion module defining an additional internal area adapted to receive additional server hardware apparatus. The second surface may comprise a removeable panel, which when removed exposes a second opening configured to enable air flow from the cooling system to circulate through the additional internal area of the expansion module.

In an interconnected configuration, the micro data center module, first module and second module may be interconnected via a releasable locking mechanism. The interconnectable micro data center module may further comprise a seal on one or more of the first and second surfaces to minimize ingress between the micro data center module, first module and second module in the interconnected configuration.

The base module may further comprise a control device configured to transmit control instructions via the interconnectable transmission means to one or more of: (a) the server hardware apparatus in the micro data center module; and (b) the additional server hardware apparatus in the second module. The control device may be further configured to receive server hardware data via the interconnectable transmission means, said server hardware data comprising one or more of: (a) product and model information for server hardware apparatus and/or additional server hardware apparatus; (b) configuration information specific to the server hardware apparatus and/or additional server hardware apparatus; and (c) operational information specific to the server hardware apparatus and/or additional server hardware apparatus.

The control device may be further configured to receive sensor data from sensors located within one or more of the micro data center module and second module. The sensors may include one or more of temperature sensors, humidity sensors, water sensors, vibration sensors, fire sensors, door sensors, the sensor device capable of determining when the micro data center module is interconnected with the first module, and an additional sensor device capable of determining when the micro data center module is interconnected with the second module.

In a representative embodiment of the present disclosure, the micro data center module, first module and second module may be configured to be stackable. In a particularly preferred embodiment of the present disclosure, the interconnected configuration the micro data center module, first module and second module may be stacked vertically with the micro data center module positioned between the first module and the second module.

The interconnectable transmission means may comprise one or more mating connectors that are brought into engagement when the micro data center module, first module and second module are in the interconnected configuration. The mating connectors may be located on mating surfaces between the micro data center module, first module and second module. The mating surfaces may include one or more of: (a) the interface between the first surface of the micro data center module and a first mating surface on the first module; and (b) the interface between the second surface of the micro data center module and a second mating surface on the second module.

The present disclosure also relates to a modular micro data center comprising:

(a) a micro data center module comprising:

walls that define an internal area adapted to receive server hardware apparatus;

a first surface adapted for interconnection with a base module;

interconnectable transmission means to facilitate power and data flow between the micro data center module and the base module; and a sensor device capable of determining when the micro data center module is interconnected with the base module.

(b) the base module comprising:

a power supply configured to supply power to the micro data center module via the interconnectable transmission means; and a cooling system configured to cool the internal area of the micro data center module.

a control device configured to transmit control instructions via the interconnectable transmission means to the server hardware apparatus in the micro data center module.

The modular micro data center may further comprise a first opening located on the first surface to enable air flow from the cooling system to circulate through the internal area of the micro data center module.

In an interconnected configuration of the micro data center, the micro data center module and base module may be interconnected via a releasable locking mechanism.

The control device may be further configured to receive server hardware data via the interconnectable transmission means, said server hardware data comprising one or more of: (a) product and model information for server hardware apparatus; (b) configuration information specific to the server hardware apparatus; and (c) operational information specific to the server hardware apparatus. The control device may be further configured to receive sensor data from sensors located within one or more of the micro data center module and base module. The sensors may include one or more of temperature sensors, humidity sensors, water sensors, vibration sensors, fire sensors, door sensors, and the sensor device capable of determining when the micro data center module is interconnected with the base module.

In a representative embodiment of the present disclosure, the micro data center module and base module may be configured to be stackable. In the interconnected configuration, the micro data center module and base module may be stacked vertically with the micro data center module positioned on top of the base module

BRIEF DESCRIPTION OF DRAWINGS

Embodiments of the present invention will now be described with reference to the accompanying drawings.

These embodiments are given by way of illustration only and other embodiments of the invention are also possible. Consequently, the particularity of the accompanying drawings is not to be understood as superseding the generality of the preceding description. In the drawings.

DESCRIPTION OF EMBODIMENTS

Representative embodiments of the present disclosure relate, generally, to micro data centers and, more particularly, to an interconnectable and modular micro data center module. The disclosure has particular, but not necessarily exclusive, application to interconnectable micro data center modules for use and application in edge computing deployments and/or distributed computing environments. However, it should be understood that the disclosure is not limited to this representative embodiment, and may be implemented in other environments.

Figure 1:
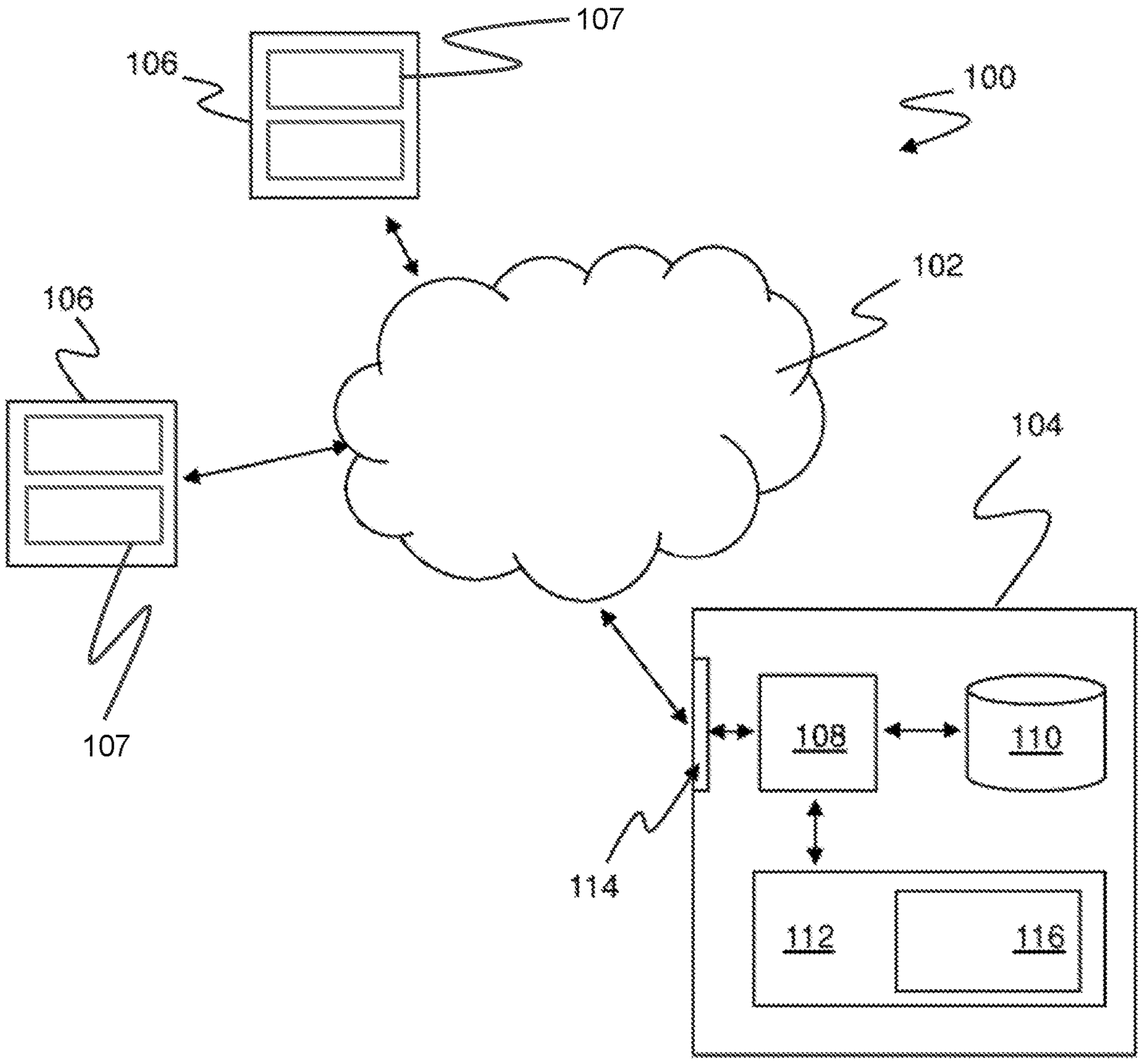
FIG. 1 is a schematic block diagram illustrating a system for controlling and monitoring a modular micro data center in accordance with a representative embodiment of the present disclosure.

FIG. 1 is a schematic diagram illustrating a system 100 within which embodiments of the present disclosure may be implemented.

The system 100 uses a communications network 102, e.g. the Internet, to facilitate control and monitoring of a modular micro data center and, more particularly, to facilitate a computer-implemented system for controlling and monitoring one or more interconnectable micro data center modules within one or more modular micro data centers in distributed locations. In the exemplary embodiment 100, a server 104 executes a web server software application for provision of services to modular micro data centers 106, each of which comprise one or more interconnectable micro data center modules 107. Communication between the server 104 and the modular micro data centers 106 is thus conveniently based upon standard hypertext transfer protocol (HTTP) and/or secure hypertext transfer protocol (HTTPS).

In a representative embodiment of the present disclosure, the modular micro data centers 106 are spread across a range of distributed locations such as, for example, in each of the various national or international offices of an organisation. As will be appreciated by persons skilled in the communication arts, various mechanisms and technologies are available to provide access to the Internet 102 from modular micro data centers (i.e. edge computing devices) 106, and all such technologies fall within the scope of the present invention.

The server 104 may generally comprise one or more computers, each of which includes at least one microprocessor 108. The number of computers and processors 108 generally depends upon the required processing capacity of the system, which in turn depends upon the number of concurrent modular micro data centers 106 which the system is designed to support. In order to provide a high-degree of scalability, for example when supporting a global user base, the server 104 may utilise cloud-based computing resources, and/or may comprise multiple server sites located in different geographical regions. The use of a cloud computing platform, and/or multiple server sites, enables physical hardware resources to be allocated dynamically in response to service demand. These and other variations, regarding the server computing resources, will be understood to be within the scope of the present invention, although for simplicity the exemplary embodiments described herein employ only a single server computer 104 with a single microprocessor 108.

The microprocessor 108 is interfaced to, or otherwise operably associated with, a non-volatile memory/storage device 110. The non-volatile storage 110 may be a hard-disk drive, and/or may include solid-state non-volatile memory such as read-only memory (ROM), flash memory, or the like. The microprocessor 108 is also interfaced to volatile storage 112, such as random access memory (RAM), which contains program instructions and transient data relating to the operation of the server 104.

In a conventional configuration, the storage device 110 maintains known program and data content relevant to the normal operation of the server system 104, including operating systems, programs and data, as well as other executable application software necessary to the intended functions of the server 104. In the embodiment shown, the storage device 110 also contains program instructions which, when executed by the processor 108, enable the server computer 104 to perform operations relating to the implementation of services and facilities embodying the present invention, such as are described in greater detail below with reference to FIGS. 3 to 6 of the drawings. In operation, instructions and data held on the storage device 110 are transferred to volatile memory 112 for execution on demand.

The microprocessor 108 is operably associated with a network interface 114 in a conventional manner. The network interface 114 facilitates access to one or more data communications networks, including the Internet 102, to enable communication between the server 104 and the modular micro data centers 106. In use, the volatile storage 112 includes a corresponding body of 116 of program instructions configured to perform processing and operations embodying features of the present invention, for example as described below with reference to FIGS. 3 to 6 of the drawings.

For example, the program instructions 116 include instructions embodying a web server application. Data stored in the non-volatile 110 and volatile 112 storage comprises web-based code for presentation and/or execution on the modular micro data center 106, such as HTML, and/or JavaScript code, for facilitating a web-based implementation for controlling and/or monitoring the modular micro data centers 106 and interconnectable micro data center modules 107.

An alternative implementation 200, again by way of example only, is illustrated in the schematic diagram of FIG.

2. In this alternative embodiment, at least a portion of the executable program code implementing the system is executed within the modular micro data centers 106. As shown, each modular micro data center 106 is typically a computing device (either in its own right, or by virtue of the interconnectable micro data center modules 107 that it comprises), including at least one microprocessor 202, non-volatile storage 204 and volatile storage 206. Each modular micro data center 106 also has a network interface 208, operably associated with the microprocessor 202 in a conventional manner. Accordingly, the modular micro data centers 106 are able to conduct computational processing by execution of programs stored locally, in the volatile 206 and non-volatile 204 storage, and/or downloaded via the Internet 102 through the network interface 208.

In the embodiment 200, the server 104 may be in communication with one or more databases 212, which may contain information and/or data relating to the hardware within, and/or the performance of, the modular micro data center 106 (including within the interconnectable micro data center modules 107), and additionally may include downloadable software components for execution on the modular micro data centers 106. For example, a portion of the system may be implemented via program instructions developed in a language such as Java, or some other suitable programming language, which execute on the modular micro data centers 106 in order to retrieve data via the server 104, and implement some or all of the functionality of the exemplary system of controlling and monitoring one or more interconnectable micro data center modules within one or more modular micro data centers in distributed locations, as described below with reference to FIGS. 3 to 6 of the drawings.

Client-side implementations may also include downloadable and executable code in the form of browser plugins, such as, for example, ActiveX controls for Windows-based browsers, and/or other applets or apps configured for execution within a browser environment or within a smartphone operating system environment, such as an Apple iOS environment or an Android environment.

Various implementations of embodiments of the invention will be apparent to persons skilled in the art of software engineering, including various combinations of server-side and client-side executable program components.

Figure 3:
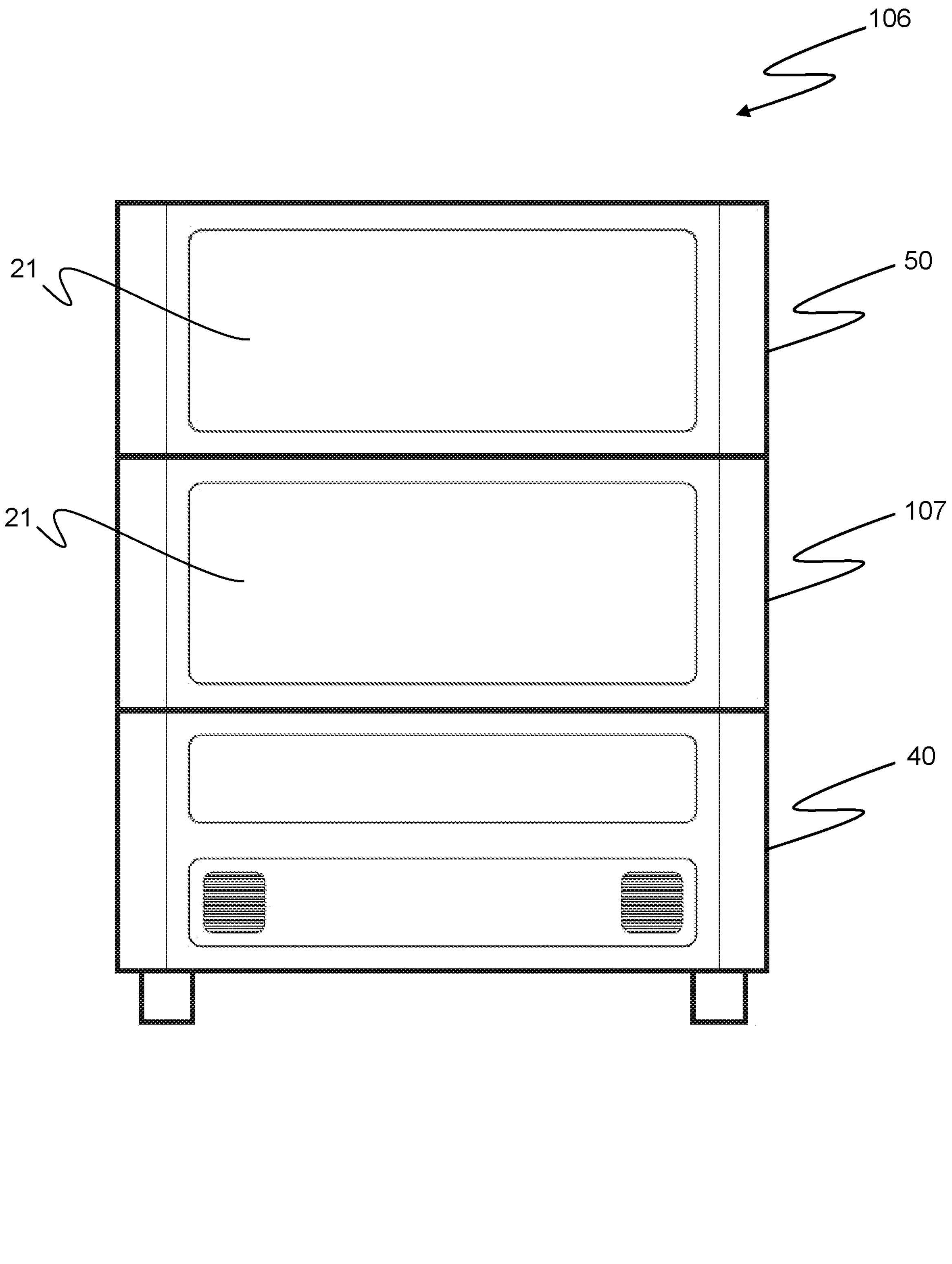
FIG. 3 is a front elevation of a modular micro data center in accordance with a representative embodiment of the present disclosure.

Turning now to FIG. 3 of the drawings, there is shown a modular micro data center 106 in accordance with a representative embodiment of the present disclosure. The modular micro data center 106 comprises an interconnectable micro data center module 107 having walls 20 that define an internal area 22 adapted to receive server hardware apparatus (not shown). It will be apparent to persons skilled in the art that server hardware apparatus includes servers (typically rack-style servers) and associated networking/switching equipment connected together via appropriate network and power cabling.

In an alternative embodiment of the present disclosure, one or more of the walls 20 of the micro data center module 107 may include a transparent window 21 to enable a user to view the server hardware apparatus (not shown) contained within the micro data center module 107.

Figure 4:
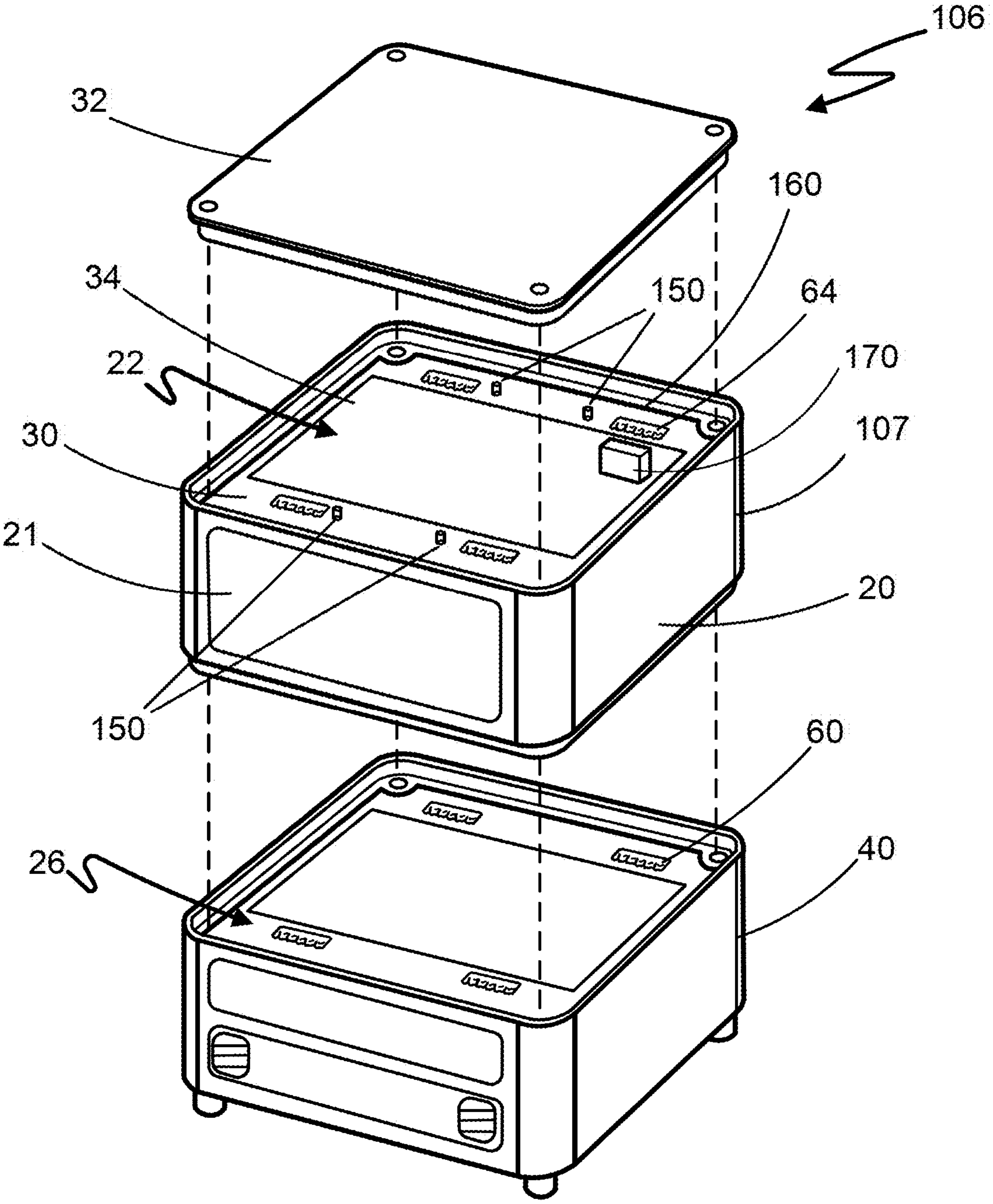
FIG. 4 is a partial exploded of a modular micro data center in accordance with a representative embodiment of the present disclosure.
Figure 5:
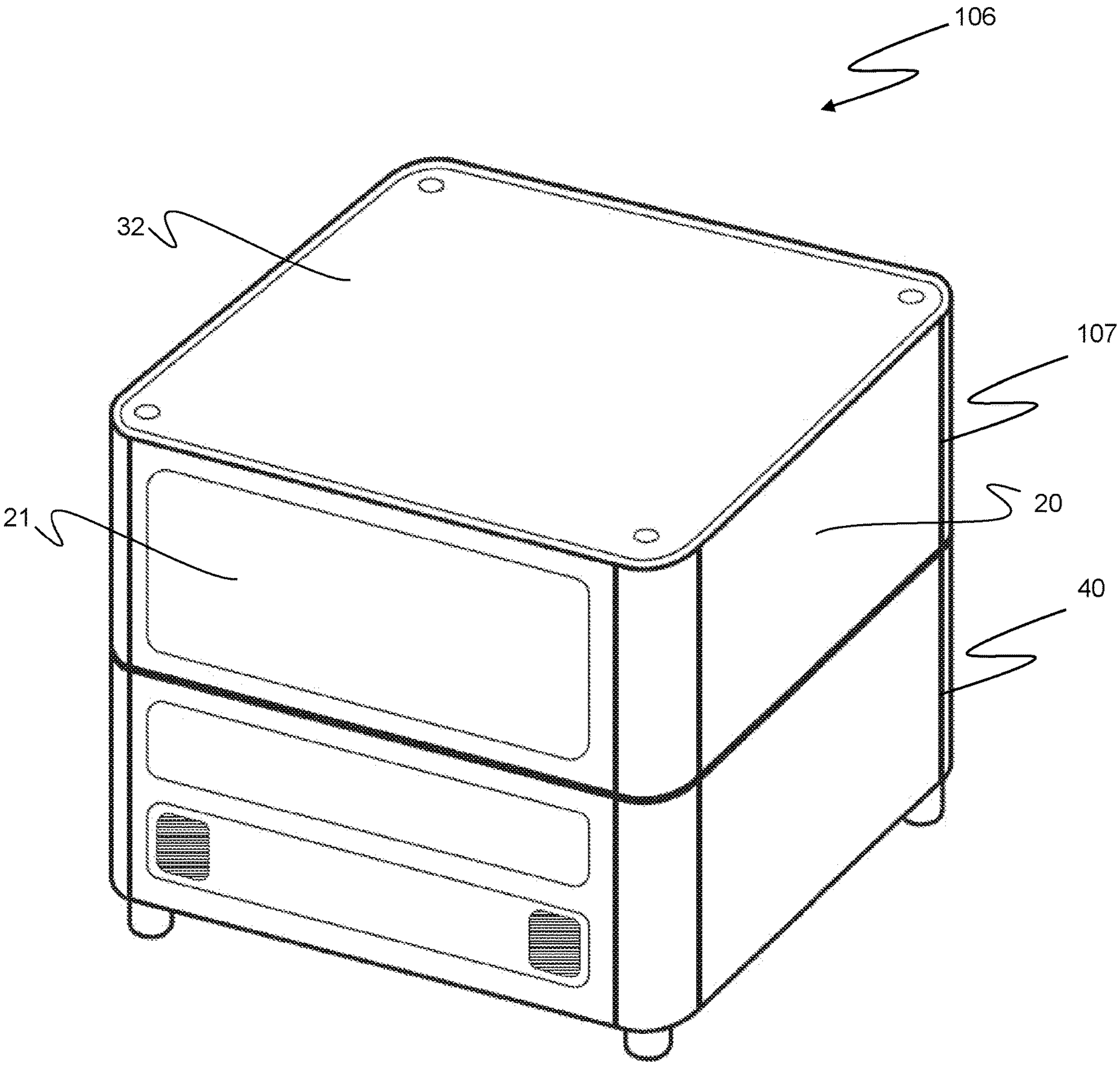
FIG. 5 is a side elevation of a modular micro data center in an interconnected configuration, in accordance with a representative embodiment of the present disclosure.

The micro data center module 107 also comprises a first surface 24 adapted for interconnection with a base module 40 (as illustrated in FIGS. 4 and 5 of the drawings), and interconnectable transmission means 26 to facilitate power and data flow between the micro data center module 107 and the base module 40. Further, the micro data center module 107 comprises a sensor device (not shown) capable of determining when the micro data center module 107 is interconnected with the base module 40.

Figure 6:
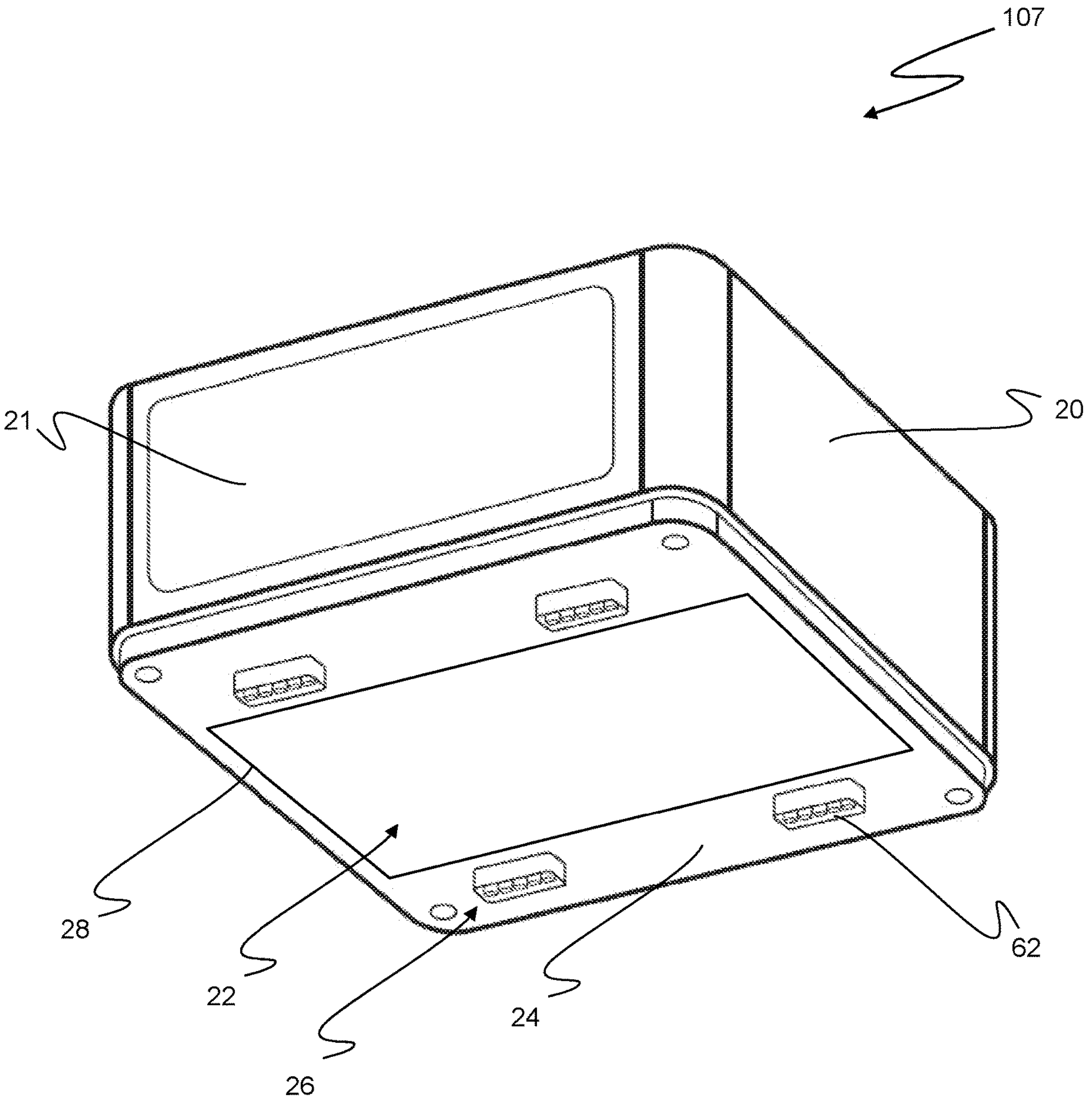
FIG. 6 is a partial side elevation of an interconnectable micro data center module in accordance with a representative embodiment of the present disclosure.

The base module 40 comprises a power supply (not shown) configured to supply power to the micro data center module 107 via the interconnectable transmission means 26. In a representative embodiment of the present disclosure, the interconnectable transmission means 26 comprises one or more mating connectors (60, 62) (as shown in FIGS. 4 and 6 of the drawings) that are brought into engagement when the micro data center module 107 and the base module 40 are interconnected (as illustrated in FIG. 5 of the drawings). The base module 40 further comprises a cooling system (not shown) configured to cool the internal area 22 of the micro data center module 107, and a control device (not shown) configured to transmit control instructions via the interconnectable transmission means 26 (and 60, 62) to the server hardware apparatus (not shown) in the micro data center module 107.

The micro data center module 107 further comprises a first opening 28 located on the first surface 24 to enable air flow from the cooling system (not shown) to circulate through the internal area 22 of the micro data center module 107. In a representative embodiment of the present disclosure, the cooling system (not shown) is preferably an air cooling/conditioning system that is capable of circulating air around and/or between the server hardware apparatus (not shown), although it should be appreciated that alterative cool systems may also be used to achieve the same result within the micro data center 106.

In an alternative embodiment of the present disclosure (not shown in the drawings), the cooling system (not shown) may be located outside of the base module 40. For example, the cooling system (not shown) may be positioned external to the micro data center 106 and connected to the micro data center module 107 via a second opening 34 in a second surface 30.

The micro data center module 107 and the base module 40 can be assembled in an interconnected configuration (as shown in FIGS. 3 and 5 of the drawings) via a releasable locking mechanism 150. The releasable locking mechanism 150 preferably enables the micro data center module 107 and the base module 40 to be locked together for safety and security reasons. It should be appreciated that any suitable releasable locking mechanism may be used to lock together the micro data center module 107 and the base module 40 including, for example, mechanical, electronic and electromechanical (e.g. electromagnetic) locking apparatus that will be apparent to persons skilled in the art.

Figure 2:
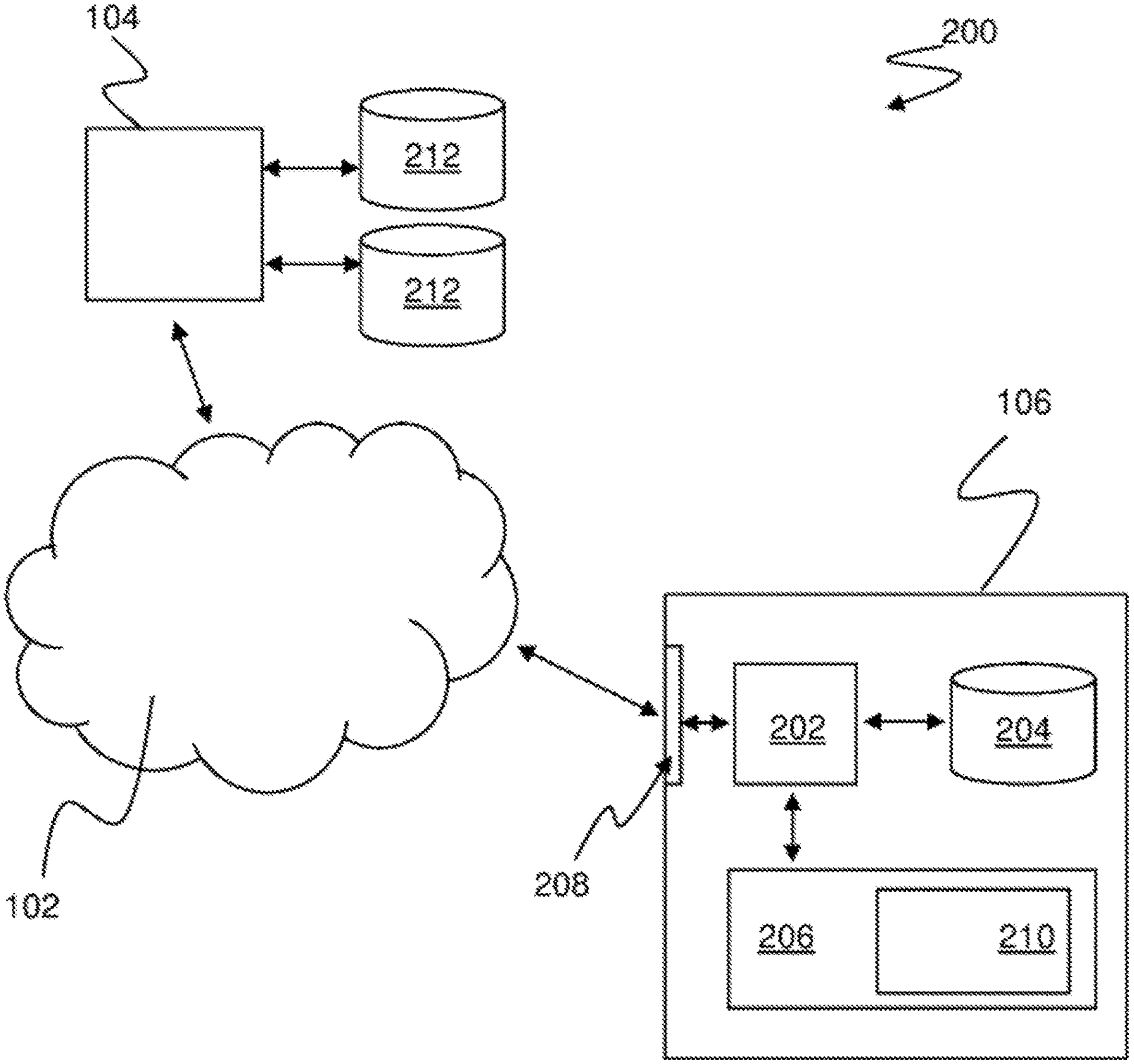
FIG. 2 is a schematic block diagram illustrating a web-based system of a system for controlling and monitoring a modular micro data center in accordance with an alternative embodiment of the present disclosure.

The control device (not shown) located in the base module 40 is further configured to receive server hardware data via the interconnectable transmission means 26 (and 60, 62). The server hardware data (relating to the server hardware apparatus (not shown) within the micro data center module 107) preferably includes product and model information for the various server hardware apparatus (not shown), configuration information specific to the server hardware apparatus (not shown), and operational information specific to the server hardware apparatus (not shown). It should be appreciated that the control device (not shown) may be communicatively coupled to a server 104 via a network interface 114 (as shown in FIG. 1 of the drawings) or, alternatively, communicatively coupled to at least one microprocessor 202 and associated network interface 208 (as shown in FIG. 2 of the drawings).

The control device (not shown) is further configured to receive sensor data from sensors 170 located within one or more of the micro data center module 107 and the base module 40. The sensors 170 include one or more of temperature sensors, humidity sensors, water sensors, vibration sensors, fire sensors, door sensors, and a sensor capable of determining when the micro data center module 107 is interconnected with the base module 40. It should be appreciated that the sensor capable of determining when the micro data center module 107 is interconnected with the base module 40 may be mechanical, electronic (using, for example, radio-frequency identification (RFID) communication technology), and/or electro-mechanical (e.g. electromagnetic) in nature and operation.

As illustrated in FIGS. 3 and 5 of the drawings, the micro data center module 107 and base module 40 are configured to be stackable in a vertical configuration with the micro data center module 107 positioned substantially above the base module 40. The micro data center module 107 further comprises a seal 160 on at least the first surface 24 to minimize ingress between the micro data center module 107 and base module 40 in the interconnected configuration (shown in Figured 3 and 5 of the drawings). Depending on the application and operating environment of the micro data center 106, the seal 160 may be particularly advantageous in preventing the ingress of, for example, dust into the internal area 22 of the micro data center module 107 where the server hardware apparatus (not shown) is located.

In an alternative embodiment of the present disclosure, shown in FIG. 3 of the drawings, the micro data center module 107 further comprises a second surface 30 adapted for interconnection with an expansion module 50. The expansion module 50 has the same, or very similar configuration, as the micro data center module 107 and defines a second internal area 52 adapted to receive additional server hardware apparatus (not shown). In this alternative embodiment of the present disclosure, one or more of the walls 20 of the micro data center module 107 and/or expansion module 50 may include a transparent window 21 to enable a user to view the server hardware apparatus (not shown) contained within the micro data center module 107 and/or the additional server hardware apparatus (not shown) contained within the expansion module 50.

The second surface 30 comprises a removeable panel 32, which when removed exposes a second opening 34 configured to enable air flow from the cooling system (not shown) in the base module 40 to circulate through the internal area 22 of the micro data center module 107 and the second internal area 52 of the expansion module 50.

The micro data center module 107, base module 40 and expansion module 50 can be assembled in an interconnected configuration (as shown in FIG. 3 of the drawings) via the releasable locking mechanism 150. The releasable locking mechanism 150 preferably enables the micro data center module 107, the base module 40, and the expansion module 50 to be locked together for safety and security reasons. It should be appreciated that any suitable releasable locking mechanism may be used to lock together the micro data center module 107, base module 40, and expansion module 50 including, for example, mechanical, electronic and electro-mechanical (e.g. electromagnetic) locking apparatus that will be apparent to persons skilled in the art.

As illustrated in FIG. 3 of the drawings, the micro data center module 107, base module 40, and expansion module 50 are configured to be stackable in a vertical configuration with the micro data center module 107 positioned substantially above the base module 40, and the expansion module 50 positioned substantially above the micro data center module 107. In a representative embodiment of the present disclosure, the micro data center module 107 comprises seals 160 on both the first and second surfaces (24, 30) to minimize ingress between the micro data center module 107 and base module 40, and between the micro data center module 107 and the expansion module 50 respectively in the interconnected configuration (shown in Figured 3 of the drawings). Alternatively, or in addition, the expansion module 50 may be provided with an additional seal (not shown) on its lower surface 54 that interfaces with the second surface 30 of the micro data center module 107.

According this alternative embodiment of the present disclosure, the interconnectable transmission means 26 comprises one or more mating connectors (60, 62, 64, 66) that are brought into engagement when the micro data center module 107 and the base module 40 are interconnected, and the micro data center module 107 and the expansion module 50 are interconnected (as illustrated in FIG. 3 of the drawings).

Figure 7:
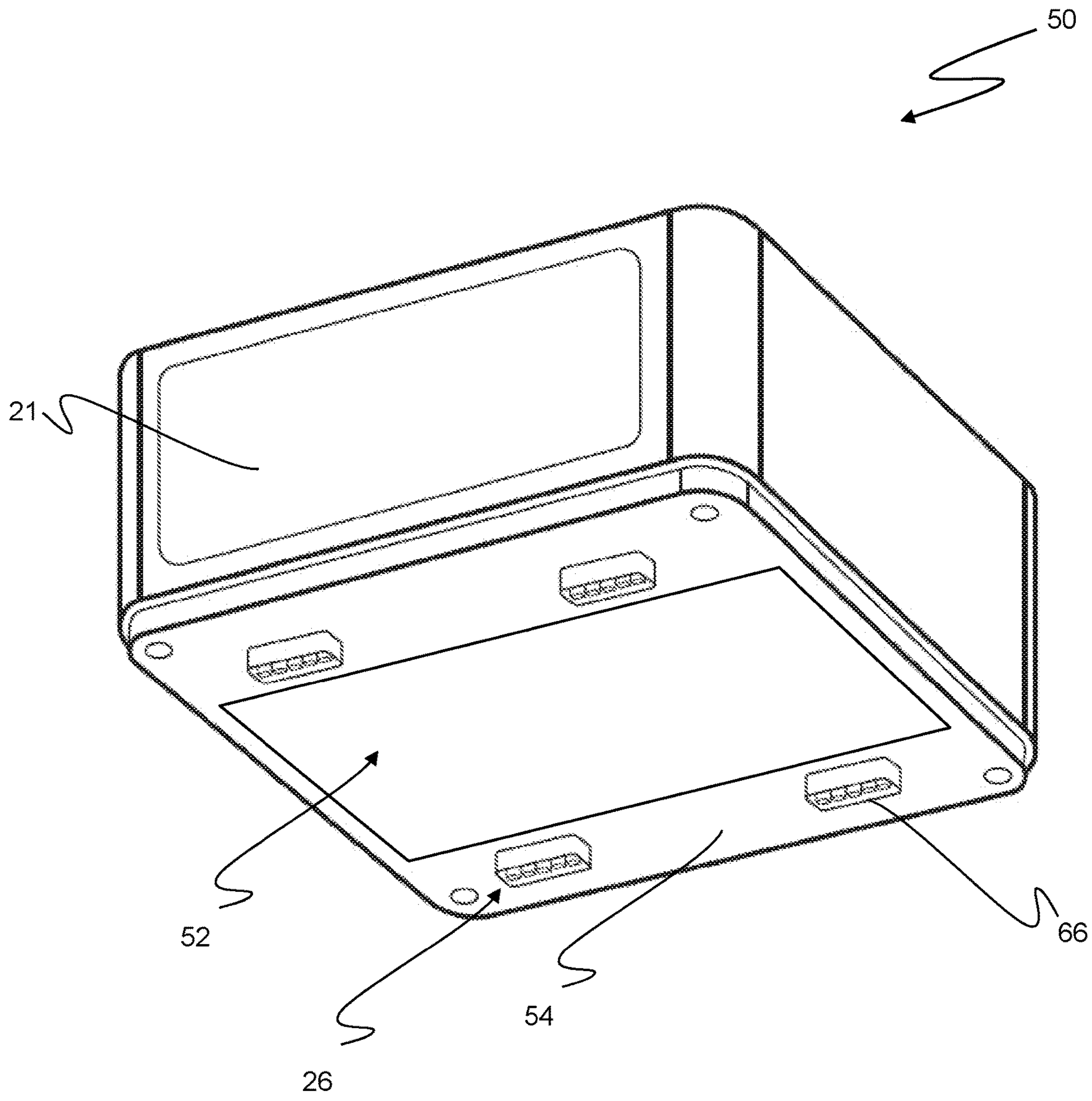
FIG. 7 is a partial side elevation of an expansion module in accordance with a representative embodiment of the present disclosure.

In a representative embodiment of the present disclosure, the mating connectors (60, 62, 64, 66) are preferably of the male-female type, within the connectors (60, 62) (as shown in FIGS. 4 and 6 of the drawings) between the micro data center module 107 and the base module 40 being male-female in either configuration, and the connectors (64, 66) (as shown in FIGS. 4 and 7 of the drawings) between the micro data center module 107 and the expansion module 50 being male-female in either configuration. The mating connectors (60, 62, 64, 66) are preferably configured to allow power and/or data to be transmitted/conveyed between the base module 40 and the micro data center 107, and between the base module 40 and the expansion module 50 (via the micro data center 107). However, it should also be appreciated that wireless means for achieving the transmission/conveyance of power and/or data may be also adopted in place of the mating connectors (60, 62, 64, 66) as the interconnectable transmission means 26.

The control device (not shown) is configured to transmit control instructions via the interconnectable transmission means 26 (and 60, 62, 64, 66) to the server hardware apparatus (not shown) in the micro data center module 107 and the additional server hardware apparatus (not shown) in the expansion module 50. The server hardware data preferably includes product and model information for the various server hardware apparatus (not shown) and additional server hardware apparatus (not shown), configuration information specific to the server hardware apparatus (not shown) and additional server hardware apparatus (not shown), and operational information specific to the server hardware apparatus (not shown) and additional server apparatus (not shown). Again, it should be appreciated that the control device (not shown) may be communicatively coupled to a server 104 via a network interface 114 (as shown in FIG. 1 of the drawings) or, alternatively, communicatively coupled to at least one microprocessor 202 and associated network interface 208 (as shown in FIG. 2 of the drawings).

The control device (not shown) is further configured to receive sensor data from sensors 170 located within one or more of the micro data center module 107, the expansion module 50, and the base module 40. The sensors 170 include one or more of temperature sensors, humidity sensors, water sensors, vibration sensors, fire sensors, door sensors, a sensor device capable of determining when the micro data center module 107 is interconnected with the base module 40, and an additional sensor device capable of determining when the micro data center module 107 is interconnected with the expansion module 50. It should be appreciated that the sensor (not shown) capable of determining when the micro data center module 107 is interconnected with the base module 40, and the additional sensor device capable of determining when the micro data center module 107 is interconnected with the expansion module 50, may be mechanical, electronic (using, for example, radio-frequency identification (RFID) communication technology), and/or electro-mechanical (e.g. electromagnetic) in nature and operation.

In accordance with a representative embodiment of the present disclosure, in the interconnected configuration (as shown in FIG. 3 of the drawings) the first opening 28 on the first surface 24 and the second opening 34 on the second surface 30 are preferably aligned to enable cool air flow from the cooling system (not shown) in the base module 40 to circulate through the internal area 22 of the micro data center module 107 and the second internal area 52 of the expansion module 50. The alignment of the first opening 28 and second opening 34 may form a cooling chute that extends between the base module 40 and the expansion module 50 and enables cool air to flow directly into the internal area 52 of the expansion module 50 and displace the warm air that would typically occupy that region of the micro data center 106. Due to the configuration of the micro data center 106, the warm air is preferably forced down through the internal area 52 of the expansion module 50 and/or the internal area of the micro data center module 107, and into the base module 40 where the cooling system (not shown) is located. This recirculation of air within the micro data center 106 minimises the need to introduce air from outside the micro data center 106 and ensures regulated cooling within the micro data center 106.

Although the above embodiments describe an expanded configuration of the modular micro data center 106 having a base module 40, one micro data center module 107 and one expansion module 50, it should be appreciated that additional micro data center modules 107 can also be included in the configuration (between the base module 40 and the expansion module 50) in order to achieve the desired size and server capability specifications for the modular micro data center 106. The inclusion of additional micro data center modules 107 in the modular micro data center 106 configuration is made efficient by the vertical stacking configuration and mating connectors (62, 64) on each of the micro data center modules 107.

As the present invention may be embodied in several forms without departing from the essential characteristics of the invention, it should be understood that the above described embodiments should not be considered to limit the present invention but rather should be construed broadly. Various modifications, improvements and equivalent arrangements will be readily apparent to those skilled in the art, and are intended to be included within the spirit and scope of the invention. The present embodiments are, therefore, to be considered in all respects as illustrative and not restrictive.

The invention claimed is:

1. An interconnectable micro data center module comprising:

walls that define an internal area adapted to receive a server hardware apparatus;

a first surface adapted for interconnection with a first module, wherein the first module includes a cooling system;

a first opening to enable air flow from the cooling system to circulate through the internal area of the micro data center module;

a second surface adapted for interconnection with a second module, wherein in an interconnected configuration the micro data center module, the first module, and the second module are interconnected via a releasable locking mechanism;

interconnectable transmission means to facilitate power and data flow between the micro data center module and the first module; and a sensor device capable of determining when the micro data center module is interconnected with the first module.

2. The interconnectable micro data center module of claim 1, wherein the first opening is located on the first surface of the micro data center module.

3. The interconnectable micro data center module of claim 1, wherein the first module is a base module containing:

a power supply configured to supply power to the micro data center module via the interconnectable transmission means; and the cooling system, wherein the cooling system is configured to cool the internal area of the micro data center module.

4. The interconnectable micro data center module of claim 1, wherein the second module is an expansion module defining an additional internal area adapted to receive an additional server hardware apparatus.

5. The interconnectable micro data center module of claim 4, wherein the second surface comprises a removeable panel, which when removed exposes a second opening configured to enable air flow from the cooling system to circulate through the additional internal area of the expansion module.

6. The interconnectable micro data center module of claim 1, further comprising a seal on one or more of the first surface or the second surface to minimize ingress between the micro data center module, the first module, and the second module in the interconnected configuration.

7. The interconnectable micro data center module of claim 4, wherein the base module further comprises a control device configured to transmit control instructions via the interconnectable transmission means to one or more of:

the server hardware apparatus in the micro data center module; and the additional server hardware apparatus in the second module.

8. The interconnectable micro data center module of claim 7, wherein the control device is further configured to receive server hardware data via the interconnectable transmission means, said server hardware data comprising one or more of:

product and model information for the server hardware apparatus and/or the additional server hardware apparatus;

configuration information specific to the server hardware apparatus and/or the additional server hardware apparatus; or operational information specific to the server hardware apparatus and/or the additional server hardware apparatus.

9. The interconnectable micro data center module of claim 7, wherein the control device is further configured to receive sensor data from sensors located within one or more of the micro data center module and the second module.

10. The interconnectable micro data center module of claim 9, wherein the sensors include one or more of:

temperature sensors;

humidity sensors;

water sensors;

vibration sensors;

fire sensors;

door sensors;

the sensor device capable of determining when the micro data center module is interconnected with the first module; and an additional sensor device capable of determining when the micro data center module is interconnected with the second module.

11. The interconnectable micro data center module of claim 1, wherein the micro data center module, the first module, and the second module are configured to be stackable.

12. The interconnectable micro data center module of claim 11, wherein in the interconnected configuration the micro data center module, the first module, and the second module are stacked vertically with the micro data center module positioned between the first module and the second module.

13. The interconnectable micro data center module of claim 12, wherein the interconnectable transmission means comprises one or more mating connectors that are brought into engagement when the micro data center module, the first module, and the second module are in the interconnected configuration.

14. The interconnectable micro data center module of claim 13, wherein the mating connectors are located on mating surfaces between the micro data center module, the first module, and the second module.

15. The interconnectable micro data center module of claim 14, wherein the mating surfaces include one or more of:

a first interface between the first surface of the micro data center module and a first mating surface on the first module; and a second interface between the second surface of the micro data center module and a second mating surface on the second module.

16. A modular micro data center comprising:

a micro data center module comprising:

walls that define an internal area adapted to receive server hardware apparatus;

a first surface adapted for interconnection with a base module, wherein the base module includes a cooling system, a first opening to enable air flow from the cooling system to circulate through the internal area of the micro data center module;

a second surface adapted for interconnection with a second module, wherein in an interconnected configuration the micro data center module, the base module, and the second module are interconnected via a releasable locking mechanism;

interconnectable transmission means to facilitate power and data flow between the micro data center module and the base module, and a sensor device capable of determining when the micro data center module is interconnected with the base module;

the base module comprising:

a power supply configured to supply power to the micro data center module via the interconnectable transmission means, and the cooling system configured to cool the internal area of the micro data center module; and a control device configured to transmit control instructions via the interconnectable transmission means to the server hardware apparatus in the micro data center module.

17. The modular micro data center of claim 16, wherein the control device is further configured to receive server hardware data via the interconnectable transmission means, said server hardware data comprising one or more of:

product and model information for the server hardware apparatus;

configuration information specific to the server hardware apparatus; or operational information specific to the server hardware apparatus.

18. The modular micro data center of claim 16, wherein the control device is further configured to receive sensor data from sensors located within one or more of the micro data center module and the base module.

19. The modular micro data center of claim 18, wherein the sensors include one or more of:

temperature sensors;

humidity sensors;

water sensors;

vibration sensors;

fire sensors;

door sensors; and the sensor device capable of determining when the micro data center module is interconnected with the base module.

20. The modular micro data center of claim 16, wherein the micro data center module and the base module are configured to be stackable.

21. The modular micro data center of claim 16, wherein in the interconnected configuration the micro data center module and the base module are stacked vertically with the micro data center module positioned on top of the base module.

* * * * *